US006240536B1

(12) United States Patent
Mikan, Jr. et al.

(10) Patent No.: US 6,240,536 B1
(45) Date of Patent: May 29, 2001

(54) SCANABLE LATCH CIRCUIT AND METHOD FOR PROVIDING A SCAN OUTPUT FROM A LATCH CIRCUIT

(75) Inventors: Donald George Mikan, Jr.; Johnny James LeBlanc, both of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/197,751

(22) Filed: Nov. 23, 1998

Related U.S. Application Data

(63) Continuation of application No. 08/790,259, filed on Jan. 27, 1997, now Pat. No. 5,896,046.

(51) Int. Cl.[7] .................................................. G01R 31/28
(52) U.S. Cl. ........................................................... 714/727
(58) Field of Search .................................... 714/726, 727; 327/197, 199, 142; 326/40; 711/5; 365/154, 201

(56) References Cited

U.S. PATENT DOCUMENTS

| | | | |
|---|---|---|---|
| 4,580,066 | * | 4/1986 | Berndt .................................. 327/197 |
| 4,701,921 | * | 10/1987 | Powell et al. ......................... 714/727 |
| 4,841,485 | * | 6/1989 | Prilik et al. ........................... 365/201 |
| 4,855,669 | * | 8/1989 | Mahoney .............................. 324/73.1 |
| 5,032,783 | * | 7/1991 | Hwang et al. ........................ 324/73.1 |
| 5,047,710 | * | 9/1991 | Mahoney .............................. 324/537 |
| 5,130,568 | * | 7/1992 | Miller et al. .......................... 327/202 |
| 5,617,426 | * | 4/1997 | Koenemann et al. ................ 714/726 |
| 5,734,660 | * | 3/1998 | Fujisaki ................................. 714/726 |
| 5,880,595 | * | 3/1999 | Whetsel ................................. 326/16 |
| 6,055,659 | * | 4/2000 | Whetsel ................................. 714/726 |

OTHER PUBLICATIONS

Bhattacharya, et al.(The Impact of Trench Isolation on Latch–up Immunity in Bulk Nonepitaxial CMOS. IEEE, 1991).*
Chatterjee, et al.(A Shallow Trench Isolation Study for 0.25/0.18 micrometer CMOS Technologies and Beyond. IEEE, 1996).*
Tsai, et al.(Tutorial on Design for Testability. IEEE, 1992).*

* cited by examiner

*Primary Examiner*—Albert Decady
*Assistant Examiner*—Guy Lamarre
(74) *Attorney, Agent, or Firm*—Russell D. Culbertson; Shaffer & Culbertson, LLP; Mark McBurney

(57) ABSTRACT

A latch circuit (10) includes a feedback path which is isolated from a circuit critical path (12). A scan input component (22) is coupled to the feedback path for providing scan test data to the latch circuit (10). A scan output component (23) may also be coupled to the feedback path for providing a separate scan out signal.

25 Claims, 2 Drawing Sheets

SCANABLE LATCH CIRCUIT AND METHOD FOR PROVIDING A SCAN OUTPUT FROM A LATCH CIRCUIT

CROSS REFERENCE TO RELATED APPLICATION

This application is a continuation of U.S. patent application Ser. No. 08/790,259, filed Jan. 27, 1997, now U.S. Pat. No. 5,896,046 and entitled LATCH STRUCTURE FOR RIPPLE DOMINO LOGIC, the disclosure of which is incorporated herein by reference. The benefit of this earlier application is claimed under 35 U.S.C. Section 120.

TECHNICAL FIELD OF THE INVENTION

This invention relates to semiconductor integrated circuits and, more particularly, to a latch circuit which may be scan tested.

BACKGROUND OF THE INVENTION

Semiconductor integrated circuit devices may be designed to allow simplified failure diagnostic testing. One design technique which allows such testing is referred to as scan path design. In scan path design, circuit elements are arranged to form a series of linked shift registers for diagnostic testing purposes. The bit shift route through these linked shift registers is referred to as a scan path. A bit shift operation is used to serially supply diagnostic test data to each of the linked circuit elements.

Each circuit element in the scan path includes a scan input, in addition to the regular data input and data output for the circuit element. During a scan test operation for a circuit element, the normal operation of the circuit element is inhibited. With scan testing enabled, a signal applied to the scan input of a typical scanable circuit element produces a corresponding scan out signal at the circuit element's data output. A scan out signal may also be provided at a separate scan output. The scan out signal produced by the circuit element in response to the scan in signal should coincide with the signal which would have resulted in the normal operation of the circuit. Failure of the circuit element to produce the predicted scan out signal indicates a failure of the circuit element.

Although the ability to scan test circuit elements in an integrated circuit simplifies diagnostic testing, there have been drawbacks to scan path design. One such drawback is the effect of the additional scan test circuitry on the performance of a circuit element in normal operation. Scan test circuitry associated with a particular circuit element may add substantial capacitance to the circuit element critical path. This added capacitance results in a substantial reduction in the performance of the circuit element in normal operation.

SUMMARY OF THE INVENTION

It is an object of invention to provide a scanable latch circuit in which the additional scan circuitry does not substantially impair the performance of the circuit in normal operation. It is also an object of invention to provide a method for providing a scan output from a latch circuit without substantially incurring a performance penalty in the normal operation of the latch circuit.

A latch circuit according to invention applies scan input data through a feedback path which is isolated from the latch circuit critical path. "Isolated" in this sense means that the feedback path is not directly connected to the circuit critical path. The signal on the feedback path is not directly applied to the circuit critical path but is available for controlling the signal on the circuit critical path. A separate scan out signal is also preferably derived from a signal in the latch circuit feedback path. By scan testing through the isolated feedback path, the scan circuitry adds substantially no capacitance to the latch circuit critical path.

The latch circuit includes a latch data input node connected to a data output node through a latch input component. The latch data output node comprises the circuit critical path. A feedback path connected to the output node is isolated from the data output node by first and second isolating components, preferably inverter circuits. A scan enable component, which may comprise a pass gate arrangement, is responsive to a scan enable signal to selectively decouple a first feedback node from a second feedback node in the feedback path thereby breaking the feedback path to facilitate scan testing. In normal operation, the scan enable component couples the first and second feedback nodes allowing the latch circuit to operate normally.

When a scan enable signal is applied to the scan enable component, thereby decoupling the first and second feedback nodes, a scan input component connected to the second feedback node applies a scan input signal to control the signal on the latch circuit data output node. That is, the scan input component applies scan in test data through the second feedback node, a point isolated from the latch circuit critical path. Also, the preferred form of the invention includes a scan output component which, when scan testing is enabled, utilizes a signal on the feedback path to develop a separate scan out signal. The preferred scan output component is controlled by a scan clock to hold the separate scan out signal independently of the signal at the data output node.

By applying the scan in test data through the isolated feedback path, the scan circuitry does not add capacitance to the latch circuit critical path. Also, since the scan output component uses a signal in the feedback path to produce the scan out signal, the scan output circuitry also does not add capacitance to the latch circuit critical path. Furthermore, the preferred scan clock arrangement associated with the scan out circuitry provides an additional functional output when the circuit is not operating in scan test mode.

These and other objects, advantages, and features of the invention will be apparent from the following description of the preferred embodiments, considered along with the accompanying drawings.

DESCRIPTION OF THE PREFERRED EMBODIMENTS

Figure 1:
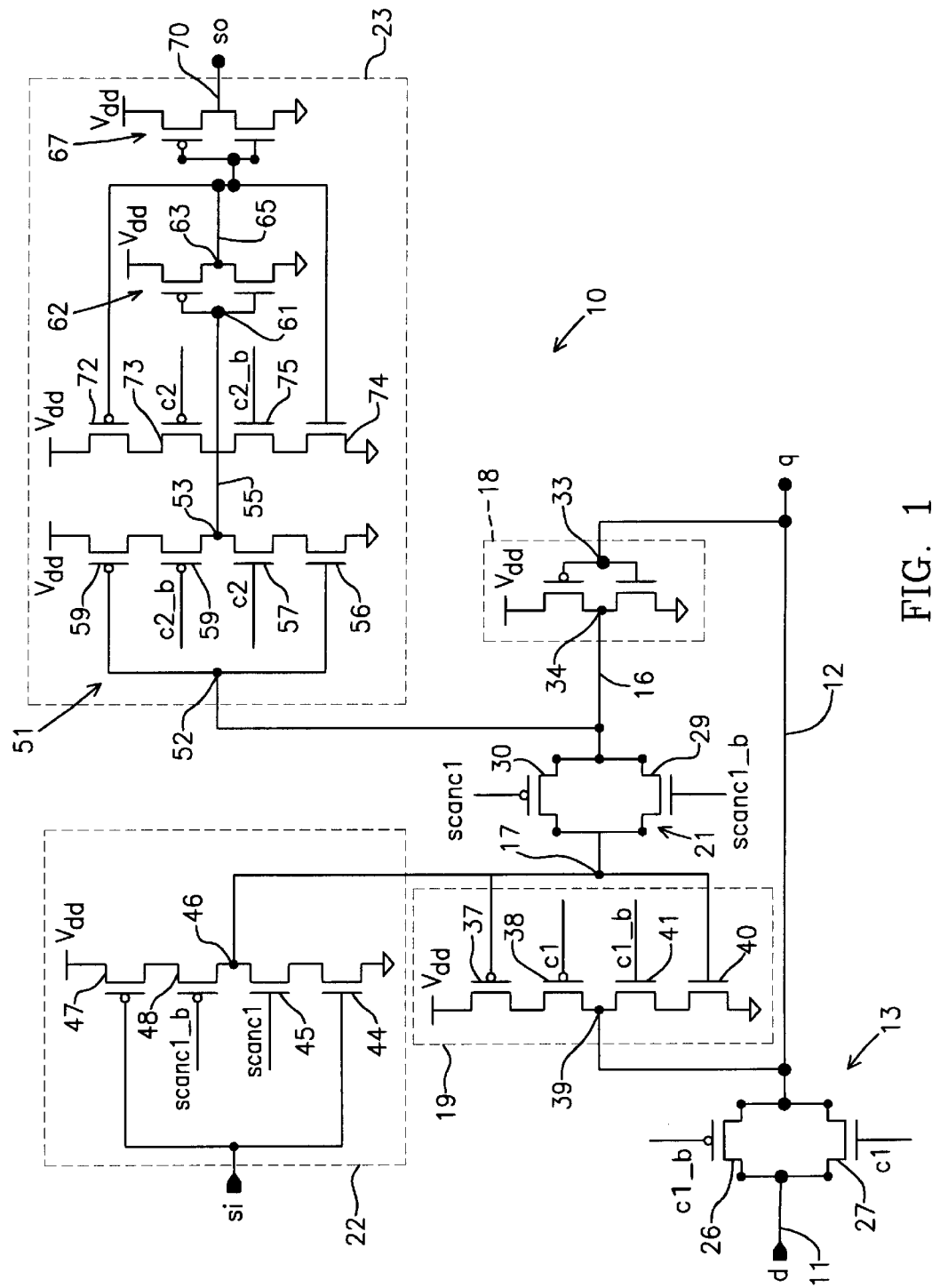
FIG. 1 is a schematic diagram of a scanable latch circuit embodying the principles of the invention.

Referring to FIG. 1, a scanable latch circuit 10 includes a data input node 11 connected to a data output node 12 by a latch input component 13. The data output node 12 comprises the circuit critical path in this form of the invention. Latch circuit 10 also includes a feedback path including a first feedback node 16 and a second feedback node 17. The feedback path is isolated from data output node 12 by first isolating component 18 and second isolating component 19. To facilitate scan testing, latch circuit 10 includes a scan enable component 21 and a scan input component 22. The preferred form of invention also includes a separate scan output component 23.

Latch circuit 10 is adapted to operate alternatively in a latch mode or in a scan test mode. In the latch mode, circuit 10 latches data "d" from data input node 11 to the latch output "q" at data output node 12. In scan test mode, latch circuit 10 accepts scan test data through scan input component 22 and produces a scan test output at output node 12 preferably along with a separate scan out signal "so" from the scan output component. The relationship between data signal "d" and latch output "q", along with the other signals associated with latch circuit 10 are shown in the timing chart of FIG. 2.

In the latch mode, latch input component 13 utilizes the signal "d" at data input node 11 to develop signal "q" at data output node 12. The illustrated latch input component 13 comprises a pass gate arrangement having a first P-type field effect transistor (FET) and a N-type FET. The drain-source conduction path of N-type device 27 connects data input node 11 to data output node 12, while the gate of the device is connected to receive a latch input signal c1. P-type device 26 has its source-drain conduction path connected between data input node 11 and data output node 12 in parallel with N-type device 27. The gate of P-type device 26 is connected to receive a signal c1_b which is the complement to the latch input signal c1. Any of the complement signals described in this disclosure, including the complement (c1_b) to latch input signal c1, may be produced by any suitable means including a suitable inverter circuit (not shown).

For the purposes of this disclosure and the following claims, the transistors will be referred to as "devices." The term "device" is intended to encompass any suitable switching device including the illustrated FETs. Those skilled in the art will appreciate that, although, the invention is disclosed in FIG. 1 as using FETs, the invention may be implemented in other transistor technology.

In the latch mode, scan enable component 21 couples first feedback node 16 to second feedback node 17 thereby closing the feedback path. The illustrated scan enable component 21 also includes a pass gate arrangement including an N-type device 29 and a P-type device 30. The P-type 30 has its source-drain conduction path connecting the first and second feedback nodes, 16 and 17 respectively, and its gate connected to receive a signal scanc1. N-type device 29 has its drain-source conduction path connected between the first and second feedback nodes, 16 and 17, and its gate connected to receive signal scanc1_b, the complement to signal scanc1. A "low" signal scanc1 and "high" signal scanc1_b place devices 29 and 30 both in a conductive state coupling the feedback nodes 16 and 17. This signal state may be referred to as a scan disabling signal state.

For purposes of this disclosure, a "high" level signal comprises a signal substantially at the system supply voltage $V_{dd}$, and representing a first logic state. A "low" level signal refers to a signal at the system reference voltage or ground representing the opposite logic state.

First isolating component 18 comprises an inverter circuit having an inverter input 33 coupled to data output node 12, and an inverter output 34 coupled to first feedback node 16. Although the preferred latch circuit 10 shown in FIG. 1 comprises an inverting circuit, those skilled in the art will appreciate that the feedback path may be isolated from data output node 12 without inverting the signal from the data output node. Such non-inverting arrangements are to be considered an equivalent to the inverting isolating arrangement shown in FIG. 1.

Second isolating component 19 comprises a clocked inverter circuit which is clocked by the latch input signal c1 and its complementary signal c1_b. The illustrated clocked inverter includes first and second P-type devices, 37 and 38 respectively, having their source-drain conduction paths connected in series between a system voltage supply $V_{dd}$ and an output node 39 which is coupled to data output node 12. The gate of first P-type device 37 is coupled to second feedback node 17 while the gate of second P-type device 38 is coupled to receive the latch input signal c1. The preferred second isolating component 19 also includes first and second N-type devices, 40 and 41 respectively, having their drain-source conduction paths connected in series between the circuit output node 39 and a system reference voltage or ground. The gate of first N-type device 40 is coupled to second feedback node 17 while the gate of second N-type device 41 is connected to receive signal c1_b.

Figure 2:
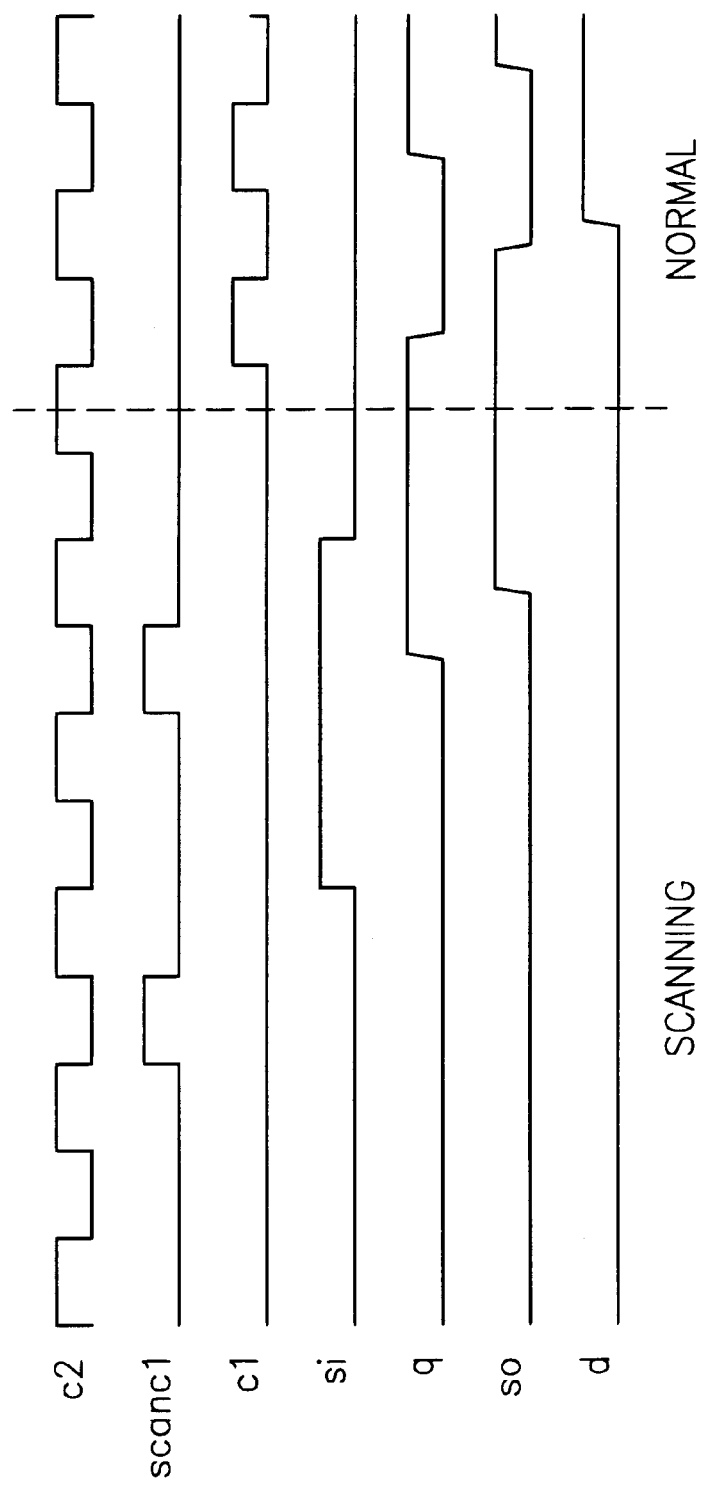
FIG. 2 is a timing chart showing the various signals utilized and produced by the circuit shown in FIG. 1.

The latch mode operation of circuit 10 may now be described with reference to both FIGS. 1 and 2. In latch mode, signal "d" at data input node 11 is used to develop signal "q" at data output node 12. In the illustrated form of the invention, a "high" level latch input signal c1 and its complement signal c1_b place both devices 26 and 27 of latch input component 13 in a conductive state allowing signal "d" at data input node 11 to pass onto data output node 12. Thus, latch output signal "q" follows latch input signal "d". Those skilled in the art will appreciate that, although, a two-device pass gate arrangement is illustrated in FIG. 1 for passing data at node 11 to the output node 12, numerous other arrangements may be employed. For example, a single device may be used to pass the data. Alternatively, inverting arrangements may be used to produce a signal "q" which is inverted with respect to data signal "d". These alternate arrangements for utilizing signal "d" at data input node 11 to develop data output signal "q" at data output node 12 are to be considered equivalents to the pass gate arrangement 13 shown in FIG. 1.

The signal at data output node 12 is inverted at the inverter circuit comprising the first isolating component 18 and this inverted signal is applied along the feedback path from first feedback node 16, through scan enable component 21, and, finally, to second feedback node 17. In the illustrated preferred form of the invention, the "high" latch input signal c1 and its complement signal c1_b disable the clocked inverter comprising the second isolating component 19 so that the inverter circuit cannot fight the development of the desired data signal "q" at data output node 12. However, once the latch input signal c1 goes "low", and its complementary signal c1_b goes "high", the second isolating circuit 19 is enabled to invert the signal at second feedback node 17, and apply the inverted signal back to data output node 12. For latch mode, Circuit 10 holds the desired latch output signal "q" at data output node 12 as long as latch input signal c1 remains "low" and its complementary signal c1_b remains "high".

In scan test mode, latch input signal c1 is continuously held "low" and its complementary signal c1_b held "high". Thus, the clocked inverter comprising second isolating component 19 remains operational so that the signal at second feedback node 17 controls "q" at data output node 12. Also, with c1 "low" and c1_b "high", signal "d" at data input node 11 has no effect on the signal at data output node 12.

To enable scan testing, scan enable component 21 is initially operated to decouple the first and second feedback nodes, 16 and 17 respectively, thereby breaking the feedback path. In the illustrated form of the invention signal scanc1 goes "high" and its complementary signal scanc1_b goes "low" to place devices 29 and 30 both in a non-conducting state to decouple nodes 16 and 17, and prevent the signal at the first feedback node 16 from affecting the signal at second feedback node 17. This "high" signal scanc1 and "low" signal scanc1_b combination may be referred to as a scan enabling signal state. Those skilled in the art will appreciate that numerous other arrangements, both inverting and non-inverting, may be employed for selectively breaking the feedback path between the two feedback nodes 16 and 17. These other arrangements are to be considered equivalent to the structure illustrated in FIG. 1.

With second feedback node 17 decoupled from first feedback node 16, scan input component 22 utilizes the scan in signal "si" to control output signal "q" through the second feedback node. In the illustrated form of the invention scan input component 22 comprises a clocked inverter which is controlled by signal scanc1 and its complement signal scanc1_b. When the scan input component 22 is operational, scan input signal "si" is inverted and this inverted signal is applied to second feedback node 17. This signal is inverted again at second isolating component 19 causing signal "q" at data output node 12 to follow the scan in signal "si". Once the desired signal "q" is developed at data output node 12, the scan enable signal scanc1 may go "low" (and its complement scanc1_b may go "high") to cause scan enable component 21 to again couple the first and second feedback nodes 16 and 17, since at this point the nodes will carry a common signal (the inverse of the signal "q" at node 12).

The illustrated scan input component 22 includes first and second N-type devices, 44 and 45 respectively, having their drain-source conduction paths connected in series between a clocked inverter output node 46 and the system reference voltage. Inverter output node 46 is coupled to second feedback node 17. The gate of first N-type device 44 is connected to receive the scan in signal "si", while the gate of second N-type device 45 is connected to receive the scan enable signal scanc1. The illustrated scan input component 22 also includes first and second P-type devices, 47 and 48 respectively, having their source-drain conduction paths connected in series between the supply voltage $V_{dd}$ and the circuit output node 46. The gate of first P-type device 47 is connected to receive scan in signal "si" and the gate of second P-type device 48 is connected to receive signal scanc1_b (the complement of scan c1).

Although output signal "q" at data output node 12 may be taken as the scan out signal when circuit 10 is operating in scan test mode, the preferred form of the invention illustrated FIG. 1 provides a separate scan output signal "so" through scan output component 23. Scan output component 23 comprises and inverter arrangement which inverts the signal developed at first feedback node 16 to provide the scan out signal "so". The preferred inverting scan out component 23 illustrated in FIG. 1 is clocked by a scan clock signal c2 to hold scan out signal "so" independently of signal "q".

The preferred scan output component 23 includes a clocked inverter 51 having an inverter input node 52 coupled to the latch circuit feedback path, preferably at first feedback node 16. An output node 53 of clocked inverter 51 is coupled to a first intermediate node 55. Clocked inverter 51 includes first and second N-type devices, 56 and 57 respectively, having their drain-source conduction paths connected in series between the clocked inverter output node 53 and the system reference voltage. The gate of first N-type device 56 is coupled to the inverter input node 52, while the gate of second N-type device 57 is connected to receive the scan clock signal c2. The preferred clocked inverter 51 further includes first and second P-type devices, 58 and 59 respectively, having their source-drain conduction paths connected in series between supply voltage $V_{dd}$ and clocked inverter output node 53. The gate of first P-type device 58 is coupled to the circuit input node 52, while the gate of second P-type device 59 is connected to receive signal c2_b, which is the complement of scan clock signal c2.

First intermediate node 55 is coupled to the input node 61 of an intermediate inverter 62 which has an output node 63 coupled to a second intermediate node 65. Second intermediate node 65 provides the input to a final inverter 67 which provides its output to scan output node 70 as scan out signal "so".

The illustrated scan output component 23 includes a feedback arrangement with first and second P-type devices, 72 and 73 respectively, having their source-drain conduction paths connected in series between the system supply voltage $V_{dd}$ and first intermediate node 55. The gate of first P-type device 72 is connected to receive the signal at the second intermediate node 65 while the gate of second P-type device 73 is connected to receive scan clock signal c2. The feedback arrangement further includes first and second N-type devices, 74 and 75 respectively, having their drain-source conduction paths connected in series between the system reference voltage and first intermediate node 55. The gate of first N-type device 74 is connected to receive the signal at the second intermediate node 65 while the gate of second N-type device 75 is connected to receive signal c2_b.

In the operation of the illustrated scan output component 23, the signal at first feedback node 16 is inverted at clocked inverter 51 and the inverted signal applied to first intermediate node 55 only when scan. clock c2 goes "high" and its complement c2_b goes "low". The signal at first intermediate node 55 is inverted again by intermediate inverter 62, and inverted a final time by final inverter 67 to provide scan out signal "so" at scan output node 70. At this point the "high" c2 signal and "low" c2_b signal turn off feedback devices 73 and 75, respectively, so that the feedback arrangement does not fight the incoming signal from the latch feedback path. However, once scan clock c2 goes "low" and its complement c2_b goes "high", the feedback arrangement of scan output component 23 holds the signal which has developed at the first intermediate node 55, and, thus, holds the scan out signal "so" at scan output node 70 for as long as the scan clock c2 remains "low". Thus, the illustrated scan output component 23 operates to provide the separate scan out signal "so" when the circuit 10 is operating in scan test mode. When circuit 10 operates in latch mode, the illustrated scan output component 23 may provide a separate functional output at scan output node 70. This separate functional output may be held independently of the signal "q" at data output node 12.

The above described preferred embodiments are intended to illustrate the principles of the invention, but not to limit the scope of the invention. Various other embodiments and modifications to these preferred embodiments may be made by those skilled in the art without departing from the scope of the following claims. For example, although the pass gates and clocked inverters set out in the illustrated form of the invention utilize duel signals (c1 and c1_b for example), other forms of the invention may operate with only single signals. Various clocking arrangements may be used for controlling a scanable latch circuit embodying the principles of the invention. Furthermore, although the illustrated latch circuit 10 comprises a static latch, scan test data may be applied according to the invention through an isolated feed back path associated with a clocked latch circuit.

What is claimed is:

1. A latch circuit comprising:
   (a) a latch input component connected between a data input node and a data output node, the latch input component receiving data on the data input node, and, in response to a latch input signal, utilizing the data on the data input node to control the signal state at the data output node;
   (b) a first isolating component having an input coupled to the data output node and an output coupled to a first feedback node on a feedback path of the latch circuit, the first isolating component for utilizing the signal state at the data output node to develop a first feedback signal at the first feedback node;
   (c) a second isolating component having an input coupled to a second feedback node on the feedback path and an output coupled to the data output node, the second isolating component utilizing a signal state at the second feedback node to control the signal state at the data output node, the first isolating component and second isolating component isolating the feedback path;
   (d) a scan enable component connected between the first feedback node and the second feedback node, the scan enable component for decoupling the first feedback node from the second feedback node in response to a scan enabling signal and for coupling the first feedback node and second feedback node in response to a scan disabling signal;
   (e) a scan input component connected between a scan input node and the second feedback node, the scan input component receiving a scan in signal from the scan input node and, in response to the scan enabling signal, utilizing the scan in signal to control a signal state at the second feedback node; and
   (f) a scan output component connected between the first feedback node and a scan output node, the scan output component for utilizing the first feedback path signal at the first feedback node to produce a scan out signal at the scan output node.

2. The latch circuit of claim 1 wherein:
   (a) the latch input component comprises a pass gate component including a N-type device and a P-type device, the N-type device having its drain-source conduction path coupling the data input node and data output node, and the P-type device having its source-drain conduction path coupling the data input node and data output node; and
   (b) the latch input signal is applied to the gate of the N-type device and a complement of the latch input signal is applied to the gate of the P-type device.

3. The latch circuit of claim 2 wherein the second isolating component includes a clocked inverter circuit comprising:
   (a) a first P-type device and a second P-type device, the first P-type device having its source-drain conduction path connected in series with the source-drain conduction path of the second P-type device to couple a voltage supply to the data output node, the gate of the first P-type device being coupled to the second feedback node, and the gate of the second P-type device being connected to receive the latch input signal; and
   (b) a first N-type device and a second N-type device, the first N-type device having its drain-source conduction path connected in series with the drain-source conduction path of the second N-type device to couple a reference voltage source to the data output node, the gate of the first N-type device being coupled to the second feedback node and the gate of the second N-type device being connected to receive the complement of the latch input signal.

4. The latch circuit of claim 1 wherein the second isolating component comprises an inverter circuit having an inverter input coupled to the second feedback node and an inverter output coupled to the data output node.

5. The latch circuit of the claim 1 wherein:
   (a) the scan enable component comprises a pass gate component having a P-type device and a N-type device, the P-type device having its source-drain conduction path coupling the first feedback node to the second feedback node, and the N-type device having its drain-source conduction path coupling the first feedback node to the second feedback to node; and
   (b) the scan enabling signal is applied to the gate of the P-type device and a complement of the scan enabling signal is applied to the gate of the N-type device.

6. The latch circuit of claim 5 wherein the scan input component includes a clocked inverter circuit comprising:
   (a) a first P-type device and a second P-type device, the first P-type device having its source-drain conduction path connected in series with the source-drain conduction path of the second P-type device to couple a voltage supply to the second feedback node, the gate of the first P-type device being coupled to the scan input node, and the gate of the second P-type device being connected to receive the complement of the scan enabling signal; and
   (b) a first N-type device and a second N-type device, the first N-type device having its drain-source conduction path connected in series with the drain-source conduction path of the second N-type device to couple a reference voltage source to the second feedback node, the gate of the first N-type device being coupled to the scan input node and the gate of the second N-type device being connected to receive the scan enabling signal.

7. The latch circuit of claim 1 wherein:
   (a) the first isolating component comprises an inverter circuit having an inverter input coupled to the data output node and an inverter output coupled to the first feedback node; and
   (b) the scan output component comprises an inverter circuit.

8. The latch circuit of claim 1 wherein the scan input component includes a clocked inverter circuit comprising:
   (a) a first P-type device and a second P-type device, the first P-type device having its source-drain conduction path connected in series with the source-drain conduction path of the second P-type device to couple a voltage supply to a first internal node, the gate of the first P-type device being coupled to the first feedback node, and the gate of the second P-type device being connected to receive a scan clock signal; and
   (b) a first N-type device and a second N-type device, the first N-type device having its drain-source conduction path connected in series with the drain-source conduction path of the second N-type device to couple a reference voltage source to the first internal node, the gate of the first N-type device being coupled to the first feedback node and the gate of the second N-type device being connected to receive a complement of the scan clock signal.

9. The latch circuit of claim 1 wherein the first isolating component comprises an inverter circuit and the scan output component comprises:
  (a) a clocked inverter circuit having an input coupled to the first feedback node and an output coupled to a first internal node;
  (b) an internal node feedback circuit coupled to the internal node and connected to receive a signal at a second internal node;
  (c) an intermediate inverter circuit having an input coupled to the first internal node and an output coupled to the second internal node; and
  (d) a final inverter circuit having its input coupled to the second internal node and an output coupled to the scan output node.

10. The latch circuit of claim 9 wherein:
  (a) the clocked inverter circuit includes:
    (i) a first P-type device and a second P-type device, the first P-type device having its source-drain conduction path connected in series with the source-drain conduction path of the second P-type device to couple a voltage supply to the first internal node, the gate of the first P-type device being coupled to the first feedback node, and the gate of the second P-type device being connected to receive a complement of a scan clock signal; and
    (ii) a first N-type device and a second N-type device, the first N-type device having its drain-source conduction path connected in series with the drain-source conduction path of the second N-type device to couple a reference voltage source to the first internal node, the gate of the first N-type device being coupled to the first feedback node and the gate of the second N-type device being connected to receive the scan clock signal; and
  (b) the internal node feedback circuit comprises:
    (i) a first P-type device and a second P-type device, the first P-type device having its source-drain conduction path connected in series with the source-rain conduction path of the second P-type device to couple the voltage supply to the first internal node, the gate of the first P-type device being coupled to the second internal node, and the gate of the second P-type device being connected to receive the scan clock signal; and
    (ii) a first N-type device and a second N-type device, the first N-type device having its drain-source conduction path connected in series with the drain-source conduction path of the second N-type device to couple the reference voltage source to the first internal node, the gate of the first N-type device being coupled to the second internal node and the gate of the second N-type device being connected to receive the complement of the scan clock signal.

11. A latch circuit for latching data supplied through a data input node, the latch circuit comprising:
  (a) a circuit critical path;
  (b) a feedback path connected to the circuit critical path, the feedback path being isolated from the circuit critical path and including a first feedback node and a second feedback node;
  (c) a scan enable component associated with the feedback path, the scan enable component isolating the first feedback node from the second feedback node in response to a scan enable signal, the signal state at the first feedback node being controlled by the signal state at the circuit critical path; and
  (d) a scan input component for controlling the signal state of the circuit critical path through the second feedback node while the second feedback node is isolated from the first feedback node.

12. The latch circuit of claim 11 further comprising:
  (e) a scan output component for utilizing the signal state at the feedback path to provide a scan out signal.

13. The latch circuit of claim 11 further comprising:
  (a) a first isolating component connected between the circuit critical path and the first feedback node for isolating the circuit critical path from the first feedback node; and
  (b) a second isolating component connected between the second feedback node and the circuit critical path for isolating the circuit critical path from the second feedback node.

14. The latch circuit of claim 13 wherein the second isolating component includes a clocked inverter circuit comprising:
  (a) a first P-type device and a second P-type device, the first P-type device having its source-drain conduction path connected in series with the source-drain conduction path of the second P-type device to couple a voltage supply to the circuit critical path, the gate of the first P-type device being coupled to the second feedback node, and the gate of the second P-type device being connected to receive a latch input signal; and
  (b) a first N-type device and a second N-type device, the first N-type device having its drain-source conduction path connected in series with the drain-source conduction path of the second N-type device to couple a reference voltage source to the circuit critical path, the gate of the first N-type device being coupled to the second feedback node and the gate of the second N-type device being connected to receive a complement of the latch input signal.

15. The latch circuit of claim 13 wherein:
  (a) the first isolating component comprises an inverter circuit having an inverter input coupled to the circuit critical path and an inverter output coupled to the first feedback node; and
  (b) the scan output component comprises an inverter circuit.

16. The latch circuit of claim 13 wherein the first isolating component comprises an inverter circuit and the scan output component comprises:
  (a) a clocked inverter circuit having an input coupled to the first feedback node and an output coupled to a first internal node;
  (b) an internal node feedback circuit coupled to the internal node and connected to receive a signal at a second internal node;
  (c) an intermediate inverter circuit having an input coupled to the first internal node and an output coupled to the second internal node; and
  (d) a final inverter circuit having its input coupled to the second internal node and an output coupled to the scan output node.

17. The latch circuit of claim 16 wherein:
  (a) the clocked inverter circuit includes:
    (i) a first P-type device and a second P-type device, the first P-type device having its source-drain conduction path connected in series with the source-drain conduction path of the second P-type device to couple a voltage supply to the first internal node, the gate of the first P-type device being coupled to the first feedback node, and the gate of the second P-type device being connected to receive a complement of a scan clock signal; and (ii) a first N-type device and a second N-type device, the first N-type device having its drain-source conduction path connected in series with the drain-source conduction path of the second N-type device to couple a reference voltage source to the first internal node, the gate of the first N-type device being coupled to the first feedback node and the gate of the second N-type device being connected to receive the scan clock signal; and (b) the internal node feedback circuit comprises:

(i) a first P-type device and a second P-type device, the first P-type device having its source-drain conduction path connected in series with the source-drain conduction path of the second P-type device to couple the voltage supply to the first internal node, the gate of the first P-type device being coupled to the second internal node, and the gate of the second P-type device being connected to receive the scan clock signal; and (ii) a first N-type device and a second N-type device, the first N-type device having its drain-source conduction path connected in series with the drain-source conduction path of the second N-type device to couple the reference voltage source to the first internal node, the gate of the first N-type device being coupled to the second internal node and the gate of the second N-type device being connected to receive the complement of the scan clock signal.

18. A method for providing a scan output from a latch circuit, the method comprising the steps of:

(a) isolating a feedback path from a latch circuit critical path, the feedback path including a first feedback node and a second feedback node;

(b) utilizing a signal at the circuit critical path to control a signal at the first feedback node;

(c) decoupling the first feedback node from the second feedback node in response to a scan enable signal;

(d) while the first feedback node is decoupled from the second feedback node, applying a scan input signal to control the signal at the circuit critical path through the second feedback node; and (e) utilizing the signal at the first feedback node to produce a scan output signal.

19. The method of claim 18 wherein the step of isolating the feedback path from the circuit critical path includes the steps of:

(a) inverting the signal at the circuit critical path and applying said inverted signal to the first feedback node; and (b) inverting the signal at the second feedback node and applying said inverted signal to the circuit critical path.

20. The method of claim 18 wherein the step of decoupling the first feedback node from the second feedback node comprises the step of:

(a) applying the scan enable signal to the gate of a first transistor connected between the first feedback node and the second feedback node, and applying a complement of the scan enable signal to a second transistor connected in parallel with the first transistor between the first feedback node and second feedback node.

21. The method of claim 18 wherein the step of applying the scan input signal includes:

(a) inverting the scan input signal and applying said inverted signal to the second feedback node.

22. The method of claim 21 further including the step of:

(a) enabling the inversion of the scan input signal with the scan enable signal.

23. The method of claim 18 wherein the step of utilizing the signal at the first feedback node to produce the scan output signal comprises the step of:

(a) inverting the signal at the first feedback node.

24. The method of claim 23 wherein the step of utilizing the signal at the first feedback node to produce the scan output signal comprises the steps of:

(a) inverting the signal at the first feedback node in response to a scan clock signal and applying said inverted signal to a first intermediate node;

(b) inverting the signal at the first intermediate node and applying said inverted signal to a second intermediate node;

(c) inverting the signal at the second intermediate node and applying said inverted signal to a scan output node; and (d) applying the signal at the second intermediate node to a feedback arrangement connected to be first intermediate node.

25. The method of claim 24 further comprising the step of operating the feedback arrangement with the scan clock signal to hold the signal at the first intermediate node.

* * * * *

UNITED STATES PATENT AND TRADEMARK OFFICE
CERTIFICATE OF CORRECTION

PATENT NO. : 6,240,536 B1  Page 1 of 1
DATED : May 29, 2001
INVENTOR(S) : Donald George Mikan Jr. et al.

It is certified that error appears in the above-identified patent and that said Letters Patent is hereby corrected as shown below:

Column 6,
Line 34, change "when scan. clock c2" to -- when scan clock c2 --; and Column 9,
Line 39, change "the source-rain" to -- the source-drain --.

Signed and Sealed this

Eighteenth Day of December, 2001

*Attest:*

*Attesting Officer*

JAMES E. ROGAN
*Director of the United States Patent and Trademark Office*